United States Patent
Ueda et al.

[19]

[11] Patent Number: 5,864,143
[45] Date of Patent: Jan. 26, 1999

[54] HIGH CURRENT ION IMPLANTER AND METHOD OF ION IMPLANT BY THE IMPLANTER

[75] Inventors: Hirokazu Ueda; Masuo Koga; Shigeo Yasuda, all of Nishiwaki, Japan

[73] Assignees: KTI Semiconductor Ltd., Nishiwaki, Japan; Texas Instruments Incorporated, Dallas, Tex.

[21] Appl. No.: 787,017

[22] Filed: Jan. 29, 1997

[30] Foreign Application Priority Data

Feb. 1, 1996 [JP] Japan ................................ 8-016559

[51] Int. Cl.⁶ .................................................. H01J 37/317
[52] U.S. Cl. ............................................................. 250/492.21
[58] Field of Search ........................................... 250/492.21

[56] References Cited

U.S. PATENT DOCUMENTS 5,148,034  9/1992  Koike ................................. 250/492.21

Primary Examiner—Jack I. Berman
Attorney, Agent, or Firm—Oblon, Spivak, McClelland, Maier & Neustadt, P.C.

[57] ABSTRACT

An ion implantation apparatus and process for ion implantation which eliminates the deterioration of device characteristics in the ion implantation process to a trench capacitor of a DRAM and increases the beam current without deteriorating the device characteristics.

A high current ion implanter includes an implantation chamber, and arranged in the following order: a bias plate, a secondary electron implantation cylinder and an extension cylinder. The extension cylinder is adjacent to the implantation chamber, held to ground potential, and has a length of 10 to 25 cm..

4 Claims, 2 Drawing Sheets

Fig. 3B Embodiment storage holding time →

HIGH CURRENT ION IMPLANTER AND METHOD OF ION IMPLANT BY THE IMPLANTER

BACKGROUND OF THE INVENTION

1. Field of the Invention

The present invention relates to a high current ion implanter and method of ion implant by the implanter, and more specifically relates to a high current ion implanter to be used to perform ion implantation of $1 \times 10^{14}$ (1E14) atms/cm$^2$ or more using a beam of large current (1 mA or more) in a semiconductor substrate (wafer) in a semiconductor process, and method of ion implant by the implanter.

2. Description of the Related Art

A high current ion implanter is used in cases where ion implantation processing is performed continuously, for example, to plural sheets of wafer using a beam current of mA order or more, and such ion implantation apparatus is generally called a high current implanter.

A high current ion implanter is used, for example, to form an ion implantation layer of a source/drain region in a MOS transistor manufacturing process or to form a high density laver of arsenic (As) at the substrate side serving as an electrode part of a trench capacitor. Such layer formation is performed in an ion implantation process requiring a high ion implantation amount (dose amount) of about 1E15 atms/cm$^2$ or more, and it seems advantageous to raise an ion beam current as large as possible from the perspective of mass production efficiency (throughput).

When an ion implantation layer is formed using a high current ion implanter, for example, in a source/drain region in a MOS transistor manufacturing process where a device is already formed on a wafer substrate, it is known that as the ion beam current is raised charge-up occurs and serious damage is produced in the device subjected to ion implantation. In order to suppress the charge-up, a high current ion implanter is provided with a mechanism called an electron shower. That is, if an ion beam irradiates a surface of a sample (wafer) when a device formed on the substrate has a structure not grounded electrically, since ions of positive charge collide with the wafer surface, the wafer is electrified and positively charged. To prevent this, the electron shower is an inevitable function for an ion implantation apparatus.

The electron shower which prevents or suppresses charge-up as above described operates by an electron beam being irradiated together with the ion beam to the sample surface thereby neutralizing the plus charge. The electron shower is performed in an ion implantation apparatus as shown in FIG. 4 where a secondary electron implantation cylinder 4 with a tungsten filament 3 and a grounded extension cylinder 11 are installed at the downstream side of a bias plate 2 immediately before the ion beam B enters an implantation chamber 1. More concretely, current flows through the tungsten filament 3 thereby emitting thermoelectrons, the thermoelectrons are irradiated to a metal surface within the secondary electron implantation cylinder 4 thereby emitting secondary electrons, and the secondary electrons are applied to the wafer surface irradiated by the ion beam B thereby neutralizing the plus charge.

Usually in a process where there is fear of damage due to the charge-up as above described, a manufacturing engineer first supplies electrons to a wafer in a TEG (test element group) subjected to ion implantation (ion beam current) via an electron shower or plasma corresponding to the ion beam current. The engineer optimizes the number of secondary electrons emitted from the mechanism to prevent the charge-up, and sets the ion implantation conditions using an ion beam current as large as possible considering the desired productivity.

The above description describes the damage caused by the charge-up occurring while the ion beam current is raised and ions are emitted. In cases where a high density layer of n+ at the substrate side serving as an electrode part of a trench capacitor of a DRAM (dynamic RAM) is formed by ion implantation, even if charge-up occurs on the wafer, no thin oxide film susceptible to damage from charge-up exists on the side of the wafer exposed to the ion beam. It has therefore been generally thought that the ion beam current could be increased without limit during ion implantation.

According to experiments by the present inventors, however, regarding ion implantation to the trench capacitor of a DRAM, it has been confirmed that under conditions where the ion beam current is constant, even if the number of secondary electrons generated from the electron shower is set to vary largely, the electric characteristics (charge holding characteristics) of the capacitor and the yield of the device do not vary. On the other hand, it has been also confirmed that as the ion beam current is increased, both the electric characteristics (charge holding characteristics) of the capacitor and the yield of the device deteriorate.

As described above, when an ion implantation layer is formed on the source/drain region where a device has been previously formed on the wafer substrate, if the ion beam current is increased, the charge-up generated on the wafer produces a problem by breaking the insulation film of the device. It has been found out that if the ion beam current is increased in such a manner, deterioration of the device occurs which can not be explained from the charge-up even when a high density layer of n+ at the substrate side serving as an electrode part of the trench capacitor is formed by ion implantation.

Therefore, the present inventors have repeated the study described above in order to clarify the mechanism of deterioration of the device element or its main cause which can not be explained by charge-up phenomenon. That is, an object of the present invention is not only to eliminate the deterioration of the device characteristics in the ion implantation process for the trench capacitor of a DRAM, but also to provide a high current ion implanter and method of ion implant by the implanter which can increase the beam current without deteriorating the device characteristics.

SUMMARY OF THE INVENTION

In order to attain the foregoing objects, a high current ion implanter according to the present invention comprises an implantation chamber, and arranged in the following order a bias plate, a secondary electron implantation cylinder, and an extension cylinder controlled to ground potential having a length of 10 to 25 cm, wherein said extension cylinder is adjacent to said implantation chamber.

Alternatively, a high current ion implanter comprises an implantation chamber; and arranged in the following order a bias plate having an applied voltage, a secondary electron implantation cylinder, and an extension cylinder having an applied voltage wherein said extension cylinder is adjacent to said implantation chamber and the voltage applied to said bias plate and the voltage applied to said extension cylinder are set individually.

In another embodiment, a high current ion implanter comprises an implantation chamber, and arranged in the following order a bias plate, a secondary electron implantation cylinder, and an extension cylinder divided into first and second extension cylinders wherein a voltage is applied to each extension cylinder individually and wherein said second extension cylinder is adjacent to said implantation chamber.

The present invention also includes an ion implantation method using a high current ion implanter, said implanter comprising an implantation chamber and arranged in the following order a bias plate, a secondary electron implantation cylinder and an extension cylinder having an end adjacent to said implantation chamber, comprising the steps of applying a ground potential to the inside of said extension cylinder so that, beginning from the end of said extension cylinder, a length of 10 cm or more of said extension cylinder is at ground potential, and subjecting a wafer to an ion beam current of 2 mA to 10 mA during ion implantation.

Alternatively, the method includes using a high current ion implanter where said implanter comprises an implantation chamber and arranged in the following order a bias plate, a secondary electron implantation cylinder and an extension cylinder having an end adjacent to said implantation chamber, comprising the steps of applying an adjustable voltage to said bias plate in the range of −1000 to 0 V, subjecting a wafer to an ion beam current of 10 mA or less during ion implantation; and subjecting the ion beam current to a Faraday cup.

Finally, the present invention includes the alternative method described above comprising the further step of applying a ground potential to the inside of said extension cylinder so that, beginning from the end of said extension cylinder, a length of 10 cm or more of said extension cylinder is at ground potential.

DETAILED DESCRIPTION OF THE PREFERRED EMBODIMENTS

Figure 1:
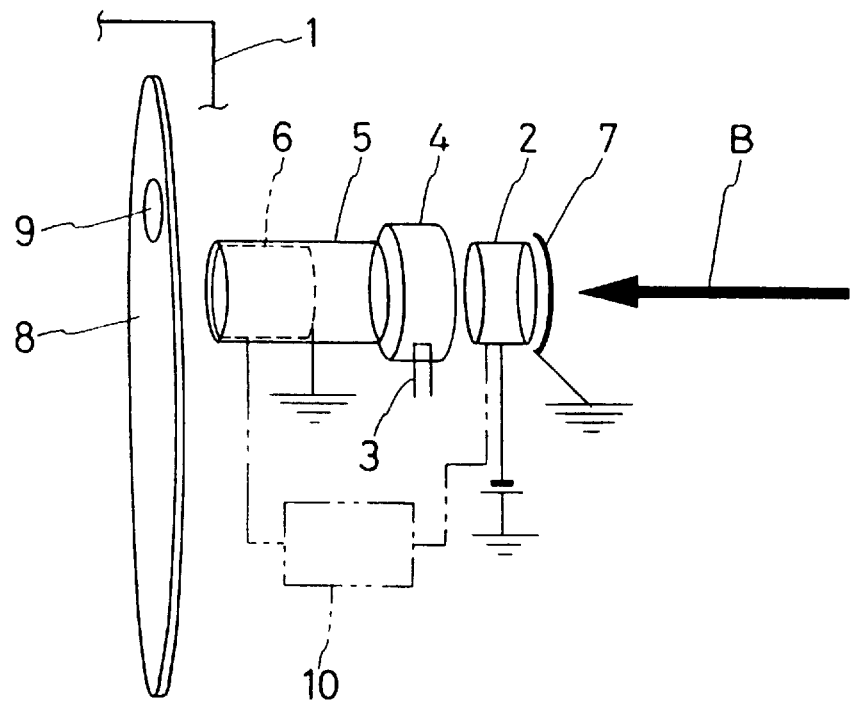
FIG. 1 is a schematic diagram of a high current ion implanter showing an embodiment of the invention.

Constitution and function of the present invention will be described as follows.

In the process of repeating the study in order to clear up the cause of the above-mentioned problems, the present inventors noticed that the charge holding characteristics of the DRAM improved significantly when ion beam implantation was tried using a secondary electron implantation cylinder provided with an extension cylinder longer than the conventional one, and the present inventors cleared up the cause. Further as a result of repeating the study, the present inventors discovered that the length of the ground potential part of the extension cylinder and the voltage applied to the bias plate have a significant relation to the problems, and have resulted in the present invention. The inventors found out that if the extension cylinder is formed long and the length of the ground potential part is made as long as 10 to 25 cm and/or if the applied voltage of the bias plate is controlled in a range of −1000 to 0 V, the ion beam current can be raised to 2 mA or more without badly affecting the wafer. If the extension cylinder is formed long and the length of the ground potential part is made as long as 10 to 25 cm, and also if the applied voltage of the bias plate is controlled in a range of −1000 to 0 V, the ion beam current can be raised to 2 mA or more without affecting the wafer. If the extension cylinder is formed long and the length of the ground potential part is made as long as 10 to 25 cm, and also if the applied voltage of the bias plate is controlled in a range of −1000 to 0 V, the ion beam current can be more stably raised to 2 mA or more. More concretely, when the length of the ground potential part of the extension cylinder is made long or the applied voltage of the bias plate is made small, even if the ion beam current is raised to 2 mA or more. ions can be injected to the wafer without producing charge-up or deterioration of the device characteristics. Also, since the ion beam can be made uniform and uneven distribution (hot spot) in the ion current density within the ion beam can be eliminated, self-annealing damage can be reduced during the ion implantation to the wafer substrate subjected to the ion implantation. In addition, in the prior art, the length of the extension cylinder was short (about 5 cm) and attention was not paid to the length of the ground potential part. As also explained in the prior art, using the TEG (test element group), the amount of secondary electron emission for the ion implantation conditions (ion beam current) and charge-up prevention was optimized.

In the present invention, if the length of the ground potential part of the extension cylinder is 10 to 25 cm and/or if the applied voltage of the bias plate Is −1000 to 0 V as above described, charge-up can be prevented or suppressed even if the ion beam current is raised. Also, regarding the ion implantation process for the trench capacitor, ions can be injected to the wafer without deteriorating the device characteristics. The reasons are described below.

FIG. 1 shows a schematic diagram of a high current ion implanter according to the present invention. The ion implantation apparatus is provided with a bias plate 2, a secondary electron implantation cylinder 4 having a tungsten filament 3 and an extension cylinder 5 grounded in the order from the upstream side to the downstream side of the ion beam line immediately before the ion beam B enters an implantation chamber 1. In this constitution, the ground potential part 6 of the extension cylinder 5 is 10 to 25 cm long. In addition, the extension cylinder 5 is the same length as the ground potential part 6 or about 25 cm at most. Also in the figure, numeral 7 designates a ground plate, numeral 8 designates a disk within the implantation chamber 1, and numeral 9 designates a wafer set on the disk 8 respectively.

In the high current ion implanter described above, a 10 to 25 cm length of the inside of the extension cylinder 5 (ground potential part 6) is made ground potential measuring from the downstream end of the cylinder, thereby allowing the shape of the ion beam B to be widened largely. The neutralization of the plus charge is performed effectively by the electron shower of the secondary electron implantation cylinder 4 and the concentration of the density of the ion beam current on the wafer 9 is suppressed. It has been confirmed again that such action of largely widening the shape of the ion beam B and suppressing the concentration of the density of the ion beam current is effective regarding the problem of charge-up and also regarding the problems not relating to charge-up. Consequently, ion implantation is most effective under conditions where the length of the ground potential part 6 of the extension cylinder 5 is within a range of 10 to 25 cm. When the length of the ground potential part 6 is less than 10 cm, the state is not changed from the conventional case. If the ion beam current is raised, the problem of the charge-up and the problem of the deterioration of the device element occur. On the other hand, if the length of the ground potential part 6 exceeds 25 cm. the length of the extension cylinder 5 itself becomes long and the apparatus becomes large. Moreover since electrons generated from the secondary electron implantation cylinder 4 can not easily attain to the wafer 9, this state seems disadvantageous from the view point of the control stability. Consequently, the length of 10 to 20 cm is more preferable.

Next, the reason for limiting the applied voltage of the bias plate to −1000 to 0 V will be described. Voltage (minus potential) applied to the bias plate 2 shown in FIG. 1 can be adjusted in the direction of becoming small and can be controlled between the minus potential and 0 V (ground potential). If the potential of the bias plate 2 becomes larger than −1000 V, for example, −1300 V as in the prior art, the ion beam B is narrowed excessively at the downstream side of the bias plate 2 and charge-up is liable to be generated. Also, a part having the ion beam current density being particularly high (hot spot) is liable to be generated in the ion beam B, and this is disadvantageous for the trench implantation of the DRAM. Consequently, the minus potential applied to the bias plate must be lowered to some extent. On the other hand, if the minus potential is lowered to a value near 0 V, since a spread of the ion beam B is feared and the uniformity of the ion beam current density may be broken, the potential shall be in range of −1000 to 0 V. If the potential is within this range, the generation of the abnormal state as above described can be suppressed. Together with the condition that the length of the ground potential part of the extension cylinder is 10 to 25 cm as above described, the ion beam current can be raised and ions can be injected without producing the problem of the charge-up or the problem of the deterioration of the device element.

In addition, the difference between the prior art and recognition in the present invention is as follows. In the prior art, if only the problem of the charge-up could be solved by the electron shower or other means (for example, supply, of secondary electrons through a plasma), it has been thought that the ion beam current density from the ion implantation apparatus can be increased. On the contrary, in the present invention it has been discovered that the degree of damage from the ion implantation is largely affected by the density of the ion beam current itself during the implantation, irrespective of whether the charge-up exists or not.

In the high current ion implanter according to the present invention as shown in FIG. 1, particularly for the ion implantation process for the trench capacitor of the DRAM, a method capable of increasing the ion beam current without deteriorating the device characteristics has been found, and this method is applied concretely. In the actual state, however, when the ion implantation apparatus is operated in a factory, the same apparatus is used for plural ion implantation processes usually. It is difficult to make the optimum conditions for the ion implantation process for the trench capacitor of the DRAM (i.e., set values of voltage applied to the ground potential part 6 of the extension cylinder 5 and to the bias plate 2 shown in FIG. 1) be coincident with the optimum conditions for other ion implantation processes, for example, the process of source/drain implantation where charge-up may occur.

For example, in implantation process where the suppressing of charge-up using the electron shower is of high preference, the voltage (minus potential) applied to the bias plate 2 shown in FIG. 1 becomes important because it serves as the potential barrier to supply secondary electrons generated from the electron shower efficiently onto the wafer 9.

However, for the ion implantation process for the trench capacitor of the DRAM, such voltage is not preferable because it acts to narrow the ion beam B is narrowed and make it small instead as above described. Also, as a demerit due to the widening of the ion beam shape excessively, it must be considered that the controllability of the implantation amount (uniformity of dose) possessed by the ion implantation apparatus deteriorates. For example, when ions are injected in a relatively small dose amount (5E14 atms/$cm^2$ or less) by the high current ion implanter, an ion beam current of about 1–2 mA or less is sufficient. A particularly important factor in the implantation condition of this case is the uniformity of the dose, the charge-up or the beam current density is not so important.

Figure 2:
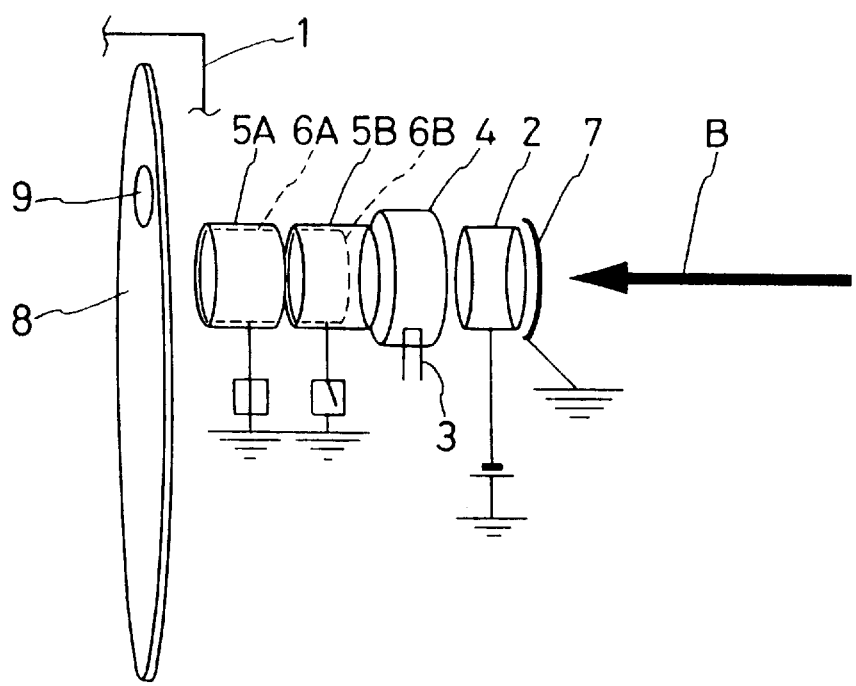
FIG. 2 is a schematic diagram of a high current ion implanter showing another embodiment of the invention.

Therefore in order to deal with the above-mentioned problems, as shown in FIG. 1, a control unit 10 is provided in connected state to the bias plate 2 and the ground potential part 6 of the extension cylinder 5. By the control unit 10, the voltage applied to the bias plate 2 and the ground potential part 6 of the extension cylinder 5 may be individually set for the ion implantation condition (recipe). Further, regarding the configuration of the extension cylinder 5 and the ground potential part 6 as shown in FIG. 1, the extension cylinder 5 and the ground potential part 6 may be arranged in a divided state longitudinally (only the ground potential part 6 will do) as shown in FIG. 2. The voltage applied to a ground potential part 6A of a first extension cylinder SA and a ground potential part 6B of a second extension cylinder 5B in the divided state may be individually set for the ion implantation condition (recipe). In this case, where widening the beam shape in the implantation process becomes key, both the ground potential part 6A of the first extension cylinder 5A and the ground potential part 6B of the second extension cylinder 5B may be set to the ground potential (earthed state). On the other hand, an ion implantation process where holding the beam shape relatively small becomes favorable, the ground potential part 6A of the first extension cylinder 5A may be set to the ground potential and the ground potential part 6B of the second extension cylinder 5B may be set to the floating potential. Consequently, the implantation process where the suppressing of charge-up using the electron shower is of high preference and the process such as the ion implantation to the trench capacitor of the DRAM where the shape of the beam is made as large as possible and the suppressing of the concentration of the density of the beam current is of high preference can be dealt with simply in the same apparatus by changing the manufacturing recipe.

Embodiments of the present invention will be described based on the accompanying Figures as follows.

A high current ion implanter used in this embodiment is shown in FIG. 1 as described above. The ion implantation apparatus is provided with a bias plate 2, a secondary electron implantation cylinder 4 having a tungsten filament 3 and an extension cylinder 5 grounded, in the order from the upstream side to the downstream side of the ion beam line immediately before the ion beam B enters an implantation chamber 1. In this constitution, the length of the ground potential part 6 of the extension cylinder 5 is specified within a range of 10 to 25 cm. In addition, in FIG. 1, numeral 7 designates a ground plate, numeral 8 designates a disk within the implantation chamber 1, and numeral 9 designates a wafer set on the disk 8 respectively.

An electron shower assembly unit comprising the bias plate 2, the secondary electron implantation cylinder 4 with the tungsten filament 3 and the extension cylinder 5 (with the ground potential part 6) grounded shown by the schematic diagram in FIG. 1 is mounted on a high current ion implanter (manufactured by Sumitomo Eaton Nova Company: type NV-GSD-A-160). Ion implantation to a trench capacitor of a 16MDRAM product was performed under the following ion implantation conditions: implantation angle 5 degrees; ion implantation amount 8E15 atms/cm$^2$ As+ used as an ion seed; voltage applied to the bias plate –1300 V; applied voltage to the ground potential part 6 of the extension cylinder 5 was 0 V (ground potential); length of both the extension cylinder 5 and the ground potential part 6 about 14 cm; and the ion beam current amount was varied in a range of 1 mA to 10 mA.

Figure 3A:
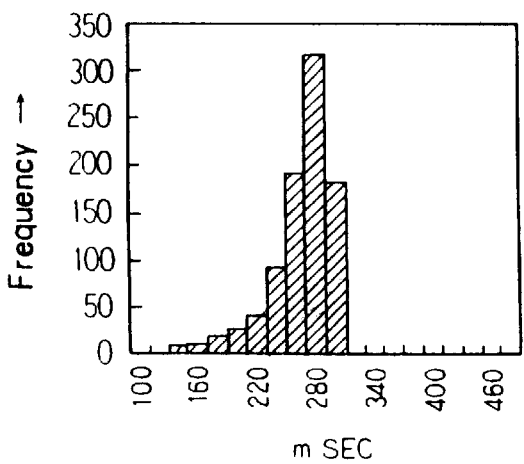
FIG. 3 is an explanation diagram showing distribution of storage holding time in a DRAM chin when ion beam current amount is 3 mA.
Figure 3A:
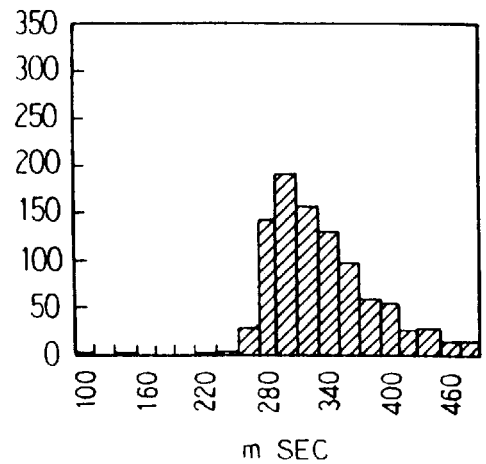
Figure 4:
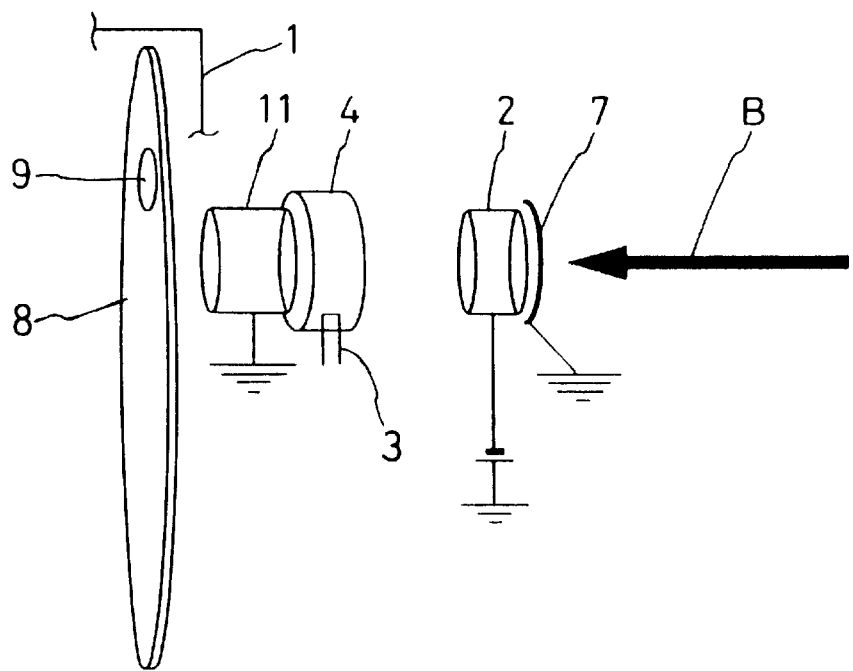
FIG. 4 is a schematic diagram of a high current ion implanter in the prior art.

Also as a comparison example, a large current type ion implantation apparatus (length of an extension cylinder 11 and length of a ground potential part being about 5 cm in both) in conventional use shown as the schematic diagram in FIG. 4 was used, and ion implantation to a trench capacitor of a 16MDRAM product was performed. Comparing this embodiment and the conventional example in the same ion beam current amount, the performance characteristics of the product (particularly the charge holding time characteristics of the capacitor) and the yield (good article rate) before performing the redundancy relief were improved significantly in this embodiment. The results are shown in FIG. 3 and Table 1 respectively. In addition, FIG. 3 shows distribution of storage holding time in a DRAM chip when the ion beam current amount is 3 mA, and Table 1 shows the relationship to the ion beam current amount and the yield (good article rate) before the redundancy relief in the ion implantation process to the trench capacitor.

TABLE 1

| Ion beam current | 1mA | 3mA | 4Ma | 5Ma |
|---|---|---|---|---|
| Prior Art | to 3% | to 1% | | |
| Embodiment | | to 6% | to 4% | to 3% |

As clearly seen from FIG. 3. in this embodiment, the storage holding time in the DRAM chip is improved by about 10% in comparison with the conventional example. Also as clearly seen from Table 1, when the ion beam current amount is increased, the yield (good article rate) before the redundancy relief shows a tendency to deteriorate both in this embodiment and in the conventional example, but the tendency is quite small in this embodiment.

Embodiment 2

A high current ion implanter (the length of the extension cylinder 11 and the length of the ground potential part both being about 5 cm) in conventional use shown by the schematic diagram in FIG. 4 was used. A DC voltage source (manufactured by Kilcusui Denshi Kogyo K. K.: 10K-10) on the market was connected to a bias plate 2, the applied voltage was constituted controllable, and ion implantation to a trench capacitor of a 16MDRAM product was performed in the following ion implantation conditions: implantation angle 5 degrees; ion implantation amount 8E15 atms/cm$^2$; As+ used as an ion seed; ion beam current amount fixed to 3 mA; applied voltage of the ground potential part of the extension cylinder 11 was 0 V (ground potential); and the voltage applied to the bias plate 2 was varied in a range of –1300 V to 0 V (ground potential). The relationship between the applied voltage to the bias plate 2 and the yield (good article rate) before the redundancy relief was investigated, and the results are shown in Table 2.

TABLE 2

| Bias plate voltage | Good article rate | Remarks |
|---|---|---|
| –1300V | to 1% | Comparison |
| –1000v | to 1% | Embodiment |
| –650V | 4 to 6% | Embodiment |
| 0v | to 2% | Embodiment |

As clearly seen from Table 2, when the voltage applied to the bias plate 2 was lowered from –1300 V gradually to 0 V, the good article rate of the product and the performance characteristics (particularly the charge holding time characteristics of the capacitor) were improved in comparison with the usual product in a manner similar to the effects seen in the embodiment described above. In this embodiment, when the voltage applied to the bias plate 2 was –650 V, the good article rate became maximized. Also when the bias plate voltage was made 0 V, the performance of the product improved in comparison with the case of the voltage being –1300 V (comparison example), but was inferior to a product made with a voltage of –650 V. When the negative voltage applied to the bias plate 2 is made small, the ion beam is widened and the uniformity of the current density of the ion beam is good. However, if the voltage applied to the bias plate 2 is made excessively small, it is suggested that the uniformity of the current density of the ion beam collapses.

As described, above, according to the high current ion implanter and method of ion implant by the implanter of the present invention, it is possible not only to eliminate the deterioration of the device characteristics in the ion implantation process to the trench capacitor of the DRAM, but also to provide a high current ion implanter and method of ion implant by the implanter. which can increase the beam current without deteriorating the device characteristics, and thereby improve mass production efficiency of ion implantation.

Obviously, numerous modifications and variations of the present invention are possible in light of the above teachings. It is therefore to be understood that within the scope of the appended claims, the invention may be practiced otherwise than as specifically described herein.

We claim:

1. A high current ion implanter comprising:
   an implantation chamber; and arranged in the following order
   a bias plate;
   a secondary electron implantation cylinder; and
   an extension cylinder controlled to ground potential having a length of 10 to 25 cm; wherein said extension cylinder is adjacent to said implantation chamber.

2. A high current ion implanter comprising;
   an implantation chamber; and arranged in the following order
   a bias plate;
   a secondary electron implantation cylinder; and
   an extension cylinder divided into first and second extension cylinders wherein a voltage is applied to each extension cylinder individually and wherein said second extension cylinder is adjacent to said implantation chamber.

3. An ion implantation method by a high current ion implanter, said implanter comprising an implantation chamber and arranged in the following order a bias plate, a secondary electron implantation cylinder, and an extension cylinder having an end adjacent to said implantation chamber, comprising the steps of:

applying a ground potential to the inside of said extension cylinder so that, beginning from the end of said extension cylinder, a length of 10 cm or more of said extension cylinder is at ground potential; and subjecting a wafer to an ion beam current of 2 mA to 10 mA during ion implantation.

4. An ion implantation method by a high current ion implanter, said implanter comprising an implantation chamber and arranged in the following order a bias plate, a secondary electron implantation cylinder and an extension cylinder having an end adjacent to said implantation chamber, comprising the steps of:

applying an adjustable voltage of −1000 to 0 V to said bias plate;

subjecting a wafer to an ion beam current of 10 mA or less during ion implantation;

subjecting the ion beam current to a Faraday cup; and applying a ground potential to the inside of said extension cylinder so that, beginning from the end of said extension cylinder, a length of 10 cm or more of said extension cylinder is at ground potential.

* * * * *